(12) United States Patent
Roddy et al.

(10) Patent No.: US 6,625,381 B2
(45) Date of Patent: Sep. 23, 2003

(54) SPECKLE SUPPRESSED LASER PROJECTION SYSTEM WITH PARTIAL BEAM REFLECTION

(75) Inventors: James E. Roddy, Rochester, NY (US); William R. Markis, Spencerport, NY (US)

(73) Assignee: Eastman Kodak Company, Rochester, NY (US)

( * ) Notice: Subject to any disclaimer, the term of this patent is extended or adjusted under 35 U.S.C. 154(b) by 89 days.

(21) Appl. No.: 09/788,866

(22) Filed: Feb. 20, 2001

(65) Prior Publication Data

US 2002/0126981 A1 Sep. 12, 2002

(51) Int. Cl.[7] .............................. G02B 6/00; H01S 3/00; H01S 3/098
(52) U.S. Cl. .............................. 385/147; 372/6; 372/19; 372/23; 372/29.011
(58) Field of Search .................. 385/907, 115, 385/116, 120, 88, 147; 372/6, 29.011, 38.1, 23, 19

(56) References Cited

U.S. PATENT DOCUMENTS

| 4,011,403 A | 3/1977 | Epstein et al. |
|---|---|---|
| 4,155,630 A | 5/1979 | Ih |
| 5,272,473 A | 12/1993 | Thompson et al. |
| 5,274,494 A | 12/1993 | Rafanelli et al. |
| 5,313,479 A | 5/1994 | Florence |
| 5,453,814 A | 9/1995 | Aiyer |
| 5,682,398 A | * 10/1997 | Gupta .......................... 372/22 |
| 6,363,088 B1 | * 3/2002 | Alphonse et al. .............. 372/6 |
| 6,470,122 B1 | * 10/2002 | Doumuki .................... 385/115 |

\* cited by examiner

Primary Examiner—Hung Xuan Dang
Assistant Examiner—Tuyen Tra
(74) Attorney, Agent, or Firm—Nelson Adrian Blish

(57) ABSTRACT

A system and method for reducing or eliminating the speckle intensity distribution of a laser imaging system. In one embodiment of the invention, a radio frequency signal is injected into a semiconductor laser light source (12) for a projection system (10) to create different speckle patterns that blend together on a projection surface (19). In another embodiment of the invention, optical feedback is used to induce a laser light source for a projection system (10) to create different speckle patterns that blend together on a projection surface (19). In another embodiment of the invention, the laser light source wavelength is Doppler shifted to produce different speckle patterns. In another embodiment of the invention, a means of deflection is used to directionally move the beam to reduce noticeable speckle.

8 Claims, 5 Drawing Sheets

SPECKLE SUPPRESSED LASER PROJECTION SYSTEM WITH PARTIAL BEAM REFLECTION

CROSS REFERENCE TO RELATED APPLICATIONS

Reference is made to commonly-assigned copending U.S. patent application Ser. No. 09/788,862, filed Feb. 20, 2001, entitled A SPECKLE SUPPRESSED LASER PROJECTION SYSTEM USING RF INJECTION, by Roddy et al.; U.S. patent application Ser. No. 09/788,978, filed Feb. 20, 2001, entitled A SPECKLE SUPPRESSED LASER PROJECTION SYSTEM USING A MULTI-WAVELENGTH DOPPLER SHIFTED BEAM now U.S. Pat. No. 6,445,487, by Roddy et al., the disclosures of which are incorporated herein.

FIELD OF THE INVENTION

This invention relates generally to a laser projection system, and more specifically to a laser imaging system incorporating speckle suppression.

BACKGROUND OF THE INVENTION

Recently, projection systems have been created that utilize lasers as a light source. Two primary forms of laser projection systems exist. One laser projection system uses a laser and a raster technique to write an image pixel by pixel to a projection surface. Another laser projection system uses a laser as an illumination source and a spatial light modulator, such as a LCD, to project an image in its entirety onto a projection surface.

Laser projection systems using a raster procedure operate by deflecting a beam of coherent light generated by a laser to form an image. The deflectors include devices such as spinning mirrors and acousto-optic deflectors (AODs). Red, green, and blue light from laser sources can be independently modulated, and then combined and scanned onto a surface using a polygon mirror or galvanometer in a color projection system.

Unfortunately, there are a number of problems associated with laser raster projection systems. For example, flicker places an upper limit on the number of pixels displayable. Only one pixel can be displayed at any given moment due to the nature of the deflectors. Furthermore, there is no persistence to the display. Since laser projection systems direct the light onto a diffusion surface, all points to be displayed must be illuminated within a time period less than the critical flicker frequency (CFF) of the human eye.

Another problem with laser raster projection systems relates to the generation of color images, which requires the use of multi-colored lasers. Substantial difficulties exist in aligning and synchronizing multiple deflectors so as to simultaneously image different colors at a given pixel location.

Liquid Crystal Displays (LCDs) are also used in projection systems that may produce speckled images. Light sources used for LCD projection systems include incandescent lamps, arc lamps, Light Emitting Diodes (LEDs) and lasers. While LEDs emit incoherent light that would not produce speckle patterns in a projected image, they do not output sufficient light for projection systems. Lamps are brighter than LEDs, but not bright enough to be used in projection systems for large screens and lamps generate considerable heat. Lasers can be used as a light source for a LCD projection system since they are capable of outputting more usable light, thus providing a very bright image over a large area.

Lasers used as light sources for laser raster or LCD projection systems produce an undesirable speckle pattern in a projected image. Laser speckle is an interference pattern that results from the reflection or transmission of highly coherent light from an optically rough surface, one whose local irregularities in depth are greater than one quarter of a wavelength. For example, if a laser beam is directed at a wall, a bright spot with a surrounding distribution of speckles is observed, rather than a uniformly illuminated spot. Laser light directed at an uneven projection surface is reflected as different phases of light. The human eye perceives these different phases as interference. Thus, the mutual interference of partially coherent beams causes the speckle pattern.

Various systems and methods have been attempted in the prior art to address speckle elimination or suppression in a projected image. Speckle reduction techniques relying on mechanical motion can be difficult to implement and are prone to failure. Diffusers are also capable of reducing speckle, but tend to be extremely loose. U.S. Pat. No. 4,011,403 discloses an object-illuminating and imaging system comprised of a laser as a light source and an optical fiber as a light transmitter. A light-flow-disruptive means acts upon the collimated illumination to reduce objectionable speckle effects. In one embodiment, a diffuser such as polytetrafluoroethylene lens or disc may be interposed in the light flow path at a location between the light source and the object viewed to reduce objectionable speckle. Alternatively, speckle effect may be reduced by vibrating one of the elements in the optical path traversed by the light beam. A speckle reduction system that uses a diffusing element, however, will result in a display system with significant optical power losses.

U.S. Pat. No. 4,155,630 discloses a process and apparatus for improving image quality by speckle elimination in a coherent light imaging system. Diffused laser light is directed onto a mirror having a rocking motion that will cause the reflected rays to sweep a two-dimensional area. The reflected light is focused through a diffuser before collimating the light for use in image creation. However, the use of both a rocking mirror and a diffuser for speckle elimination in an imaging system results in significant losses of optical power.

U.S. Pat. No. 5,272,473 discloses a coherent light projection system and method having reduced speckle. The invention is comprised of a coherent light source and a display screen. The coherent light source generates a plurality of narrow light beams that impinge on the display screen at a plurality of associated points. The display screen has a transducer that generates surface acoustic waves that traverse the associated points. Significant movement of the display screen such as to sufficiently reduce noticeable speckle is difficult, especially when the display screen is large.

U.S. Pat. No. 5,274,494 discloses a method and apparatus for reducing or eliminating the speckle intensity of distribution in a highly coherent source. A coherent beam of light is directed into Raman cells to obtain a broad spectral bandwidth beam of light having additional side wavelengths other than the original wavelength. The composite beam having broad spectral bandwidth is capable of forming images that are substantially free of speckle intensity source. It is necessary to compensate for spatial incoherence that the Raman cells cause. Furthermore, the use of multiple Raman cells introduces significant complexity in a speckle reduction system.

U.S. Pat. No. 5,313,479 discloses a system and method for a speckle-free display system comprised of at least one coherent light source, a diffusing element located in a plane intercepts coherent light beam, a spatial light modulator for receiving the diffused light beam and for generating an image light beam, and a viewing surface. The movement of the diffusing element causes the speckle interference pattern to move on the viewing surface. The diffusing element can be rotated or vibrated. A speckle reduction system that uses a rotating diffusing element, however, will result in a display system with significant optical power losses.

In addition to image projection systems incorporating speckle reduction, lithographic systems have utilized speckle reduction techniques. U.S. Pat. No. 5,453,814 discloses a uniform illumination system and method for microlithography. A light source, having a solid state laser, emits a beam that is separated into a number of segments. Segments are frequency shifted by a different amount such that they do not substantially overlap in the frequency domain. Each segment passes through a short focal length lens element of a fly's eye array to be dispersed onto a mask plane for uniformly illuminating a mask. The lens element of the fly's eye array are contained within a small region in comparison to the width of the dispersed beam segments, such that each beam segment contributes illumination to the entirety of a common portion of the mask. The system provides uniform illumination in the deep ultra-violet range without speckles or fringes. The fly's eye array of frequency shifting elements, each element of which shifts by a different frequency, is an optically complex means of incorporating speckle reduction in an image projection system.

It is, therefore, desirable to reduce speckle in a laser projection system by non-mechanical or diffusion means.

SUMMARY OF THE INVENTION

It is an object of the present invention to provide a system and method for speckle suppression in laser projection systems.

The present invention is directed to overcome the problem set forth above. Briefly summarized according to one aspect of the present invention, a speckle suppressed laser projection system comprises a constant power supply and a semiconductor laser powered by the constant power supply. On optical fiber is positioned in front of an output of the laser wherein the optical fiber induces optical feedback in the laser which causes the laser to produce a multi-wavelength output beam. An optical projection system projects the multi-wavelength beam on a screen.

In another embodiment of the present invention, a radio frequency (RF) signal is injected into at least one semiconductor laser that acts as the light source for a projection system. The injection of radio frequency changes the laser emission mode structure rapidly, thus producing multiple longitudinal lasing modes, each of which exhibits a different speckle pattern. Images projected in a projection system comprises of radio frequency injected lasers will suppress the appearance of unwanted speckle, since the differing speckle patterns produced by the different laser operational modes will be superimposed and will blend together on a projection surface.

In a further aspect of the invention, the wavelength of a laser light source for a projection system is Doppler shifted to produce different speckle patterns. In one embodiment, the laser projection system is comprised of at least one laser and an acousto-optic modulator (AOM) which changes the laser wavelength by the RF carrier frequency to the AOM. Slewing the RF carrier frequency Doppler shifts the laser wavelength, alters the speckle pattern, and reduces the delectability of the speckle in the image formed on a projection surface.

In an additional aspect of the invention, a deflector directionally moves the output beam of a laser projection system to reduce noticeable speckle in an image on a projection surface. The pointing angle of the deflected beam from the AOM is a strong function of the carrier frequency. By slewing the frequency, the beam location on the screen can be changed, thus changing the speckle pattern. The movement of the beam need only be on the order of 1 pixel which does not significantly affect the modulation transfer function (MTF) in the direction of the movement. Beam movement at approximately 45 degrees to the vertical or horizontal can minimize the loss of MTF in the horizontal and vertical directions, and be less perceptible to the eye.

The invention and its objects and advantages will become more apparent in the detailed description of the preferred embodiment presented below.

DETAILED DESCRIPTION OF THE INVENTION

The present invention will be directed in particular to elements forming part of, or in cooperation more directly with, the apparatus in accordance with the present invention. It is understood that elements not specifically shown or described may take various forms well known to those skilled in the art.

Figure 1A:
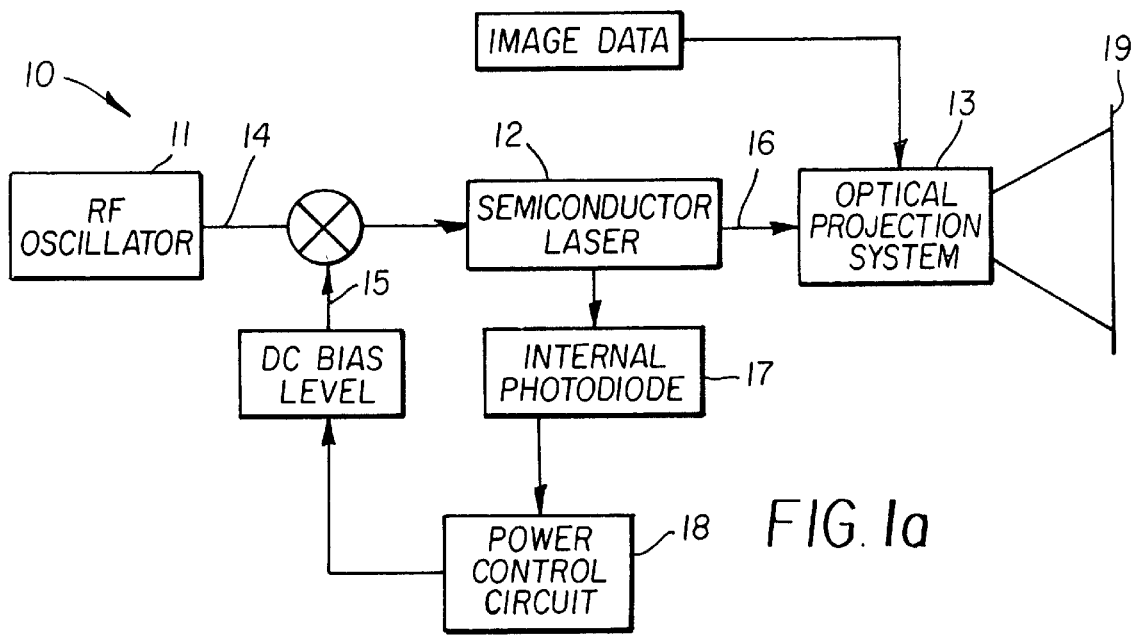
FIG. 1a is a schematic for an image projection system using a multi-longitudinal laser source using a radio frequency (RF) injected semiconductor laser in an image projection system.

FIG. 1a shows a laser projection system 10 comprising a radio frequency (RF) oscillator 11 driving a semiconductor laser 12 that acts as the light source for an image projection system 13. The RF oscillator signal 14, combined with a DC bias signal 15, drive the semiconductor laser 12. A laser beam 16 with optical power output $P_o$ is emitted from the semiconductor laser. At the same time, a monitor beam with optical power output $P_m$, at usually about 3% of P, is emitted from the semiconductor laser towards an internal photodiode 17. Power output $P_m$ from the semiconductor laser is monitored by the internal photodiode, and provides a signal to the control circuit 18. The control circuit 18 monitors the variation in the signal from the internal photodiode 17, and adjusts the DC bias current to the semiconductor laser accordingly so as to maintain constant output power.

A multi-wavelength laser beam 16 with power output $P_o$ is emitted from the semiconductor laser towards an optical projection system 13. The injection of radio frequency changes the laser emission from single mode to an effectively multimode pattern.

Figure 1B:
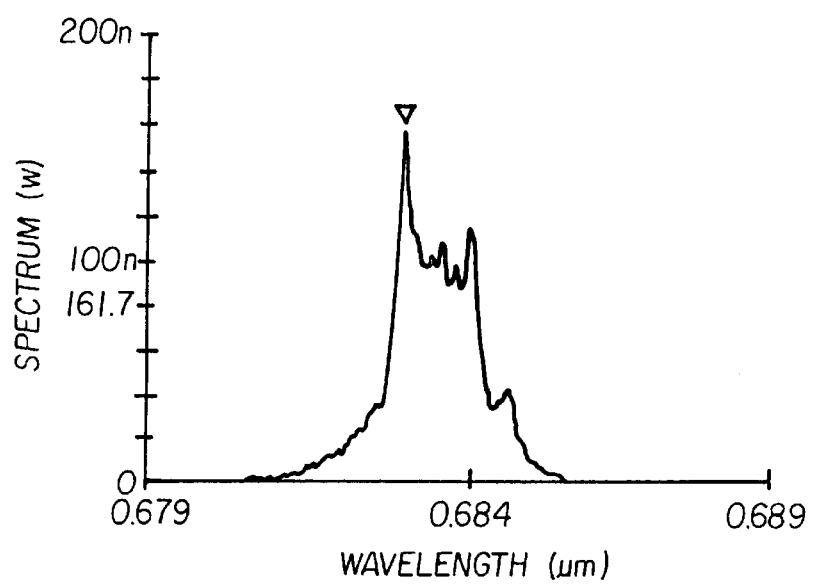
FIG. 1b is a graph of power versus wavelength for a multi-wavelength spectrum from a RF injected semiconductor laser.

FIG. 1 (b) shows a graph of a multi-wavelength spectrum from an RF injected semiconductor laser. Forced multimode operation by radio frequency injection produces approximately 4 or 5 lasing modes, each of which exhibit a different speckle pattern. Using the multimode beam as input, the optical projection system shown in FIG. 1 (a) projects an image onto a projection surface, such as a screen 19. Images projected in a projection system comprised of radio frequency injected lasers will suppress unwanted speckle patterns, since the differing speckle patterns produced by the different laser operational modes will blend together in an image.

Figure 2A:
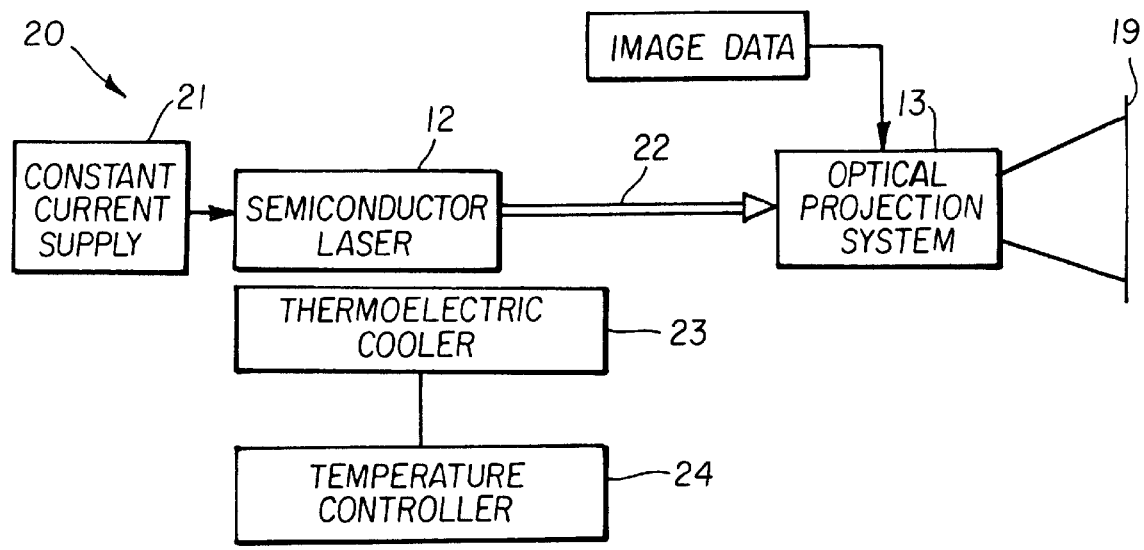
FIG. 2a is a schematic for an image projection system using an optical fiber to induce multi-longitudinal mode operation in a semiconductor laser.

FIG. 2(a) shows a schematic for a laser projection system 20 that uses a semiconductor laser system to produce a multi-longitudinal mode output by optical feedback. A constant current supply 21 provides a drive current for the semiconductor laser 12. An optical fiber 22 is positioned in front of the output beam of the laser. The semiconductor laser and the optical fiber are affixed to a thermoelectric cooler 23 to maintain a constant temperature for both elements. A temperature controller 24 monitors the thermoelectric cooler and provides a drive signal to the thermoelectric cooler. Laser output $P_o$ is directed towards the optical fiber.

The laser beam is primarily directed through the optical fiber to the optical projection system 13, but a portion of the light is reflected off of the optical fiber and back into the semiconductor laser. This induces optical feedback in the laser, which in turn induces mode hopping and multi-longitudinal mode output from the semiconductor laser. For example, semiconductor lasers available from Pointsource use a fiber pigtail to introduce optical feedback.

Figure 2B:
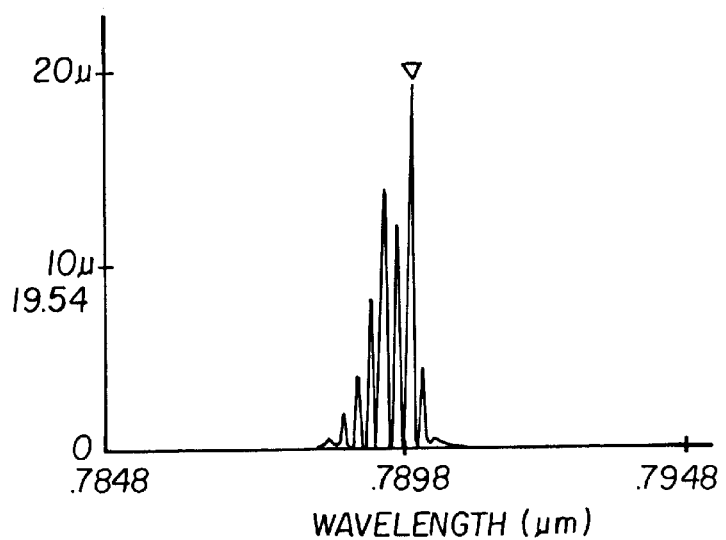
FIG. 2b is a graph of power versus wavelength for a multi-wavelength spectrum from a semiconductor laser with optical feedback from an optical fiber.

FIG. 2(b) shows the multi-wavelength spectrum from the semiconductor laser when an optical fiber is place in front of the output of the laser. Optical feedback changes the laser emission from single mode to an effectively multimode pattern. Forced multimode operation by optical feedback produces approximately 4 or 5 lasing modes, each of which exhibit a different speckle pattern. Using the multimode beam as input, the optical projection system shown in FIG. 2(a) projects an image onto a projection surface, such as a screen 19. Images projected using a projection system comprised of induced multimode lasers will suppress unwanted speckle patterns, since the differing speckle patterns produced by the different laser operational modes will blend together in an image.

Figure 3:
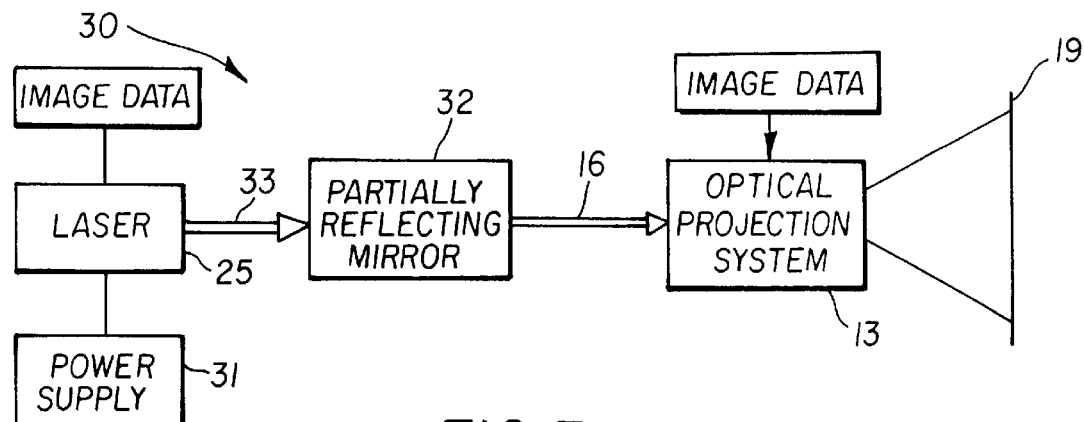
FIG. 3 is a schematic for an image projection system that uses a partially reflecting mirror to induce multi-longitudinal mode operation in a laser.

FIG. 3 shows a schematic for a laser projection system 30 with a laser system that produces a multi-longitudinal mode output by optical feedback. A laser 22 is driven by a signal form a power supply 31. The laser could be a gas laser, a semiconductor laser, or a solid state laser. The optical output power of the laser, $P_o$, is directed towards the surface of a partially reflecting mirror 32.

The laser beam 33 is partially transmitted through the mirror 32 towards the optical projection system 13. However, the laser beam is also partially reflected back towards the output window of the laser. When this light reenters the laser, it disturbs the laser cavity and causes the laser to output a multi-wavelength beam. Optical feedback changes the laser emission from single mode to an effectively multimode pattern. The laser may be instantaneously single mode, but it is forced to switch its mode structure rapidly. Forced multimode operation by optical feedback produces approximately 4 or 5 lasing modes, each of which exhibit a different speckle pattern. The multi-wavelength beam is directed towards a projection system. Because the projected beam from the optical projection system is multi-wavelength, the image formed on the imaging surface does not exhibit noticeable speckle. The varying wavelengths of the beam reduce the noticeable speckle, since the speckle patterns for each wavelength overlap and blend with each other in an image.

Figure 4:
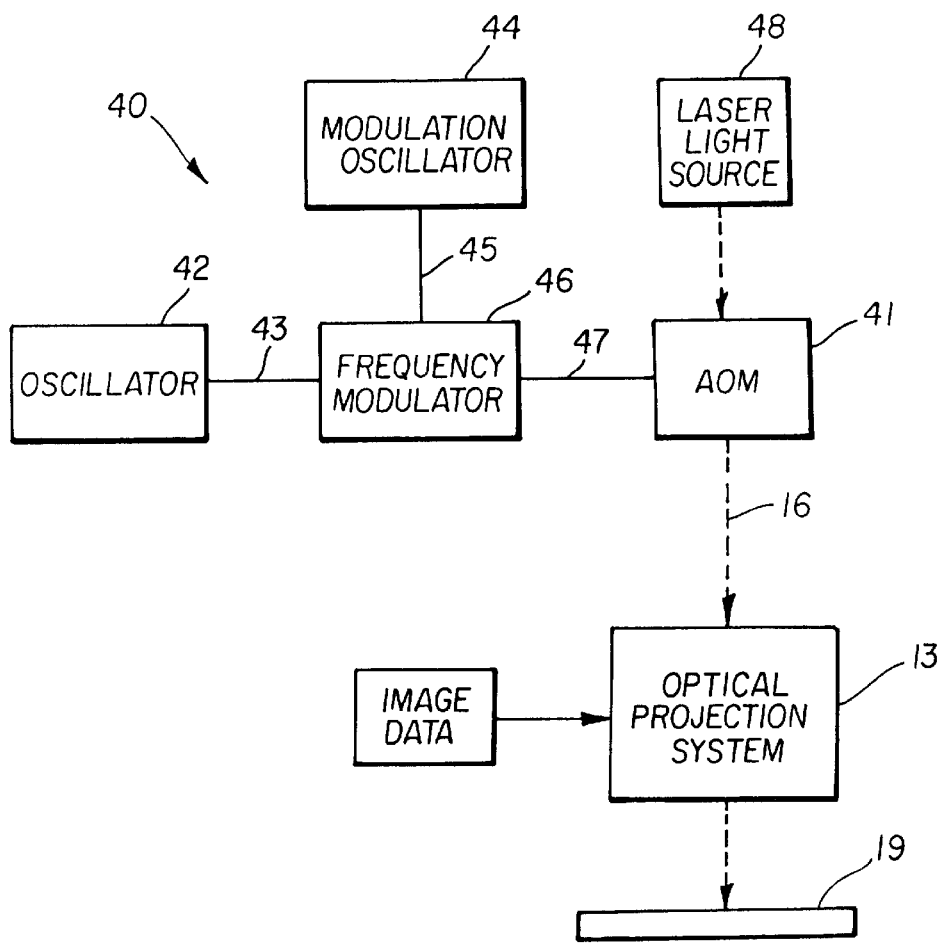
FIG. 4 is a schematic for an image projection system that uses a multi-wavelength laser beam by Doppler shifting with a variable frequency acousto-optic modulator (AOM).

FIG. 4 shows a schematic for an image projection 40 that uses a multi-wavelength laser beam 16 by Doppler shifting with a variable frequency acousto-optic modulator (AOM) 41. An oscillator 42 is used to generate a radio frequency (RF) signal 43. A modulation oscillator 44 is used to generate a modulation signal. Both the RF signal generated by the oscillator and the modulation signal are directed into a frequency modulator 46, which combines the signals to form a RF modulated signal 47 and directs the new signal into the AOM. The output of a laser 48 is directed towards the AOM that is receiving the RF modulated signal.

Slewing the RF signal frequency shifts the laser wavelength, alters the speckle pattern, and reduces the speckle in the image formed. The multi-wavelength Doppler shifted output beam from the AOM is directed towards an optical projection system 13. The projection system projects an image onto an imaging surface 19. Since the input beam to the optical projection system is a multi-wavelength beam, the varying wavelengths of the beam reduce the noticeable speckle because the speckle patterns for each wavelength overlap and blend with each other in an image. The modulation oscillator 44 need not be just a simple sinewave generating device. In order to minimize dwell at any one frequency and, therefore, the appearance of speckle, a triangle waveform is advantageous.

Figure 5:
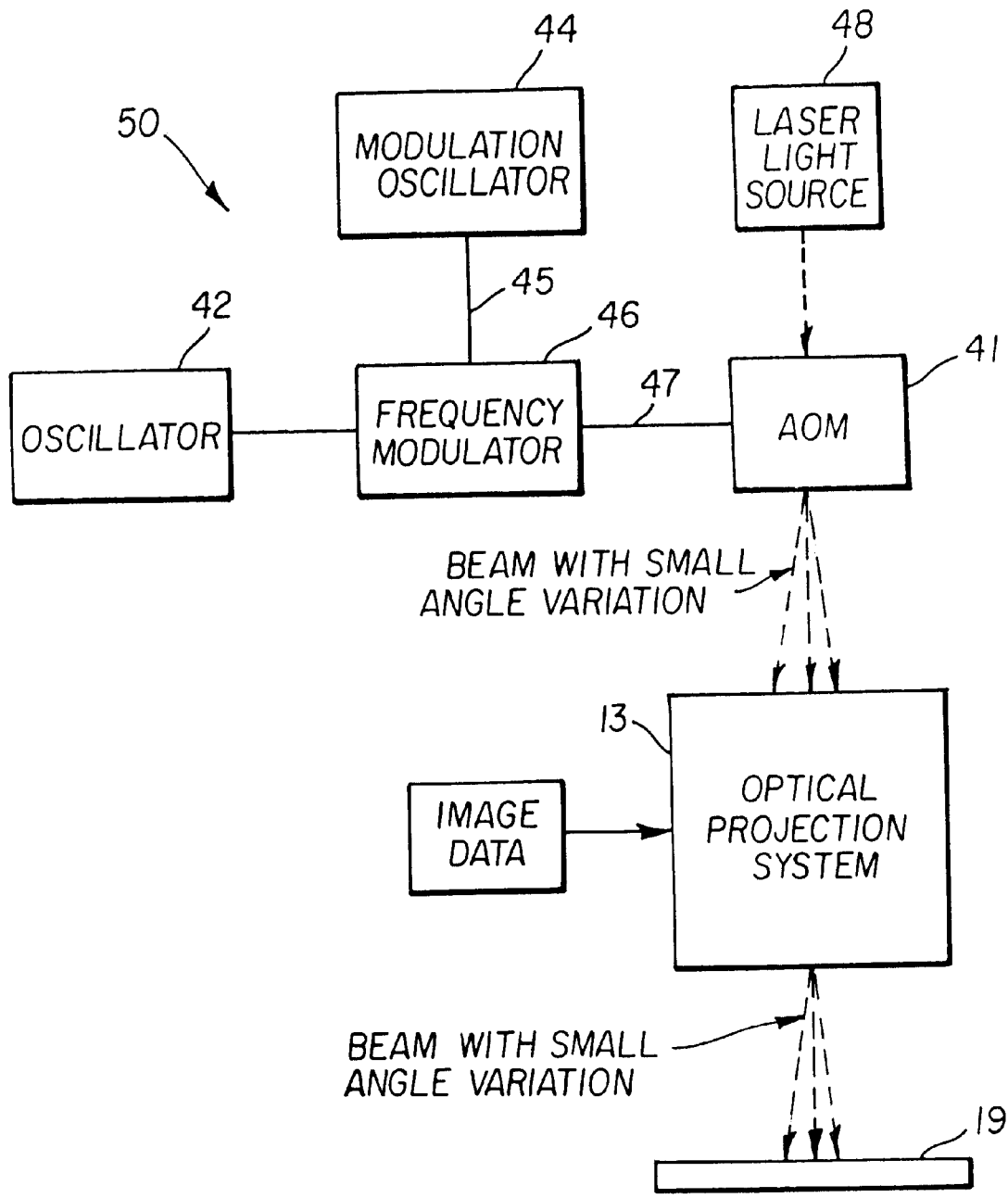
FIG. 5 is a schematic for an image projection system that uses an angularly varying laser beam by using a variable frequency AOM.

FIG. 5 shows a schematic for an image projection system 50 that uses an angularly varying laser beam with a variable frequency acousto-optic modulator (AOM). An oscillator 42 is used to generate a radio frequency (RF) signal 43. A modulation oscillator 44 is used to generate a modulation signal 45. Both the RF signal generated by the oscillator and the modulation signal are directed into a frequency modulator 46, which combines the signals to form a RF modulated signal 47 and directs the new signal into the AOM. The output of a laser is directed towards the AOM 41 that is receiving the RF modulated signal. The AOM outputs a beam with a small angle variation towards an optical projection system.

The optical projection system 50 outputs an angularly varying beam towards an imaging surface 19. By slewing the frequency, the beam location on the screen can be changed, thus changing the speckle pattern. To minimize dwell at any screen location, it is advantageous to have the modulation signal 45 generated by the modulation oscillator 44 be a triangle wave. The movement of the beam need only be approximately 1 pixel so as not to destroy the modulation transfer function (MTF) in the direction of the movement. Since the eye is very sensitive to horizontal and vertical edges, but less sensitive to angles in between, beam movement of approximately 45 degrees can minimize the perceived loss of MTF in the horizontal and vertical directions. However, the beam movement frequency must be high enough to prevent any obvious flicker to the eye. For example, as noted in U.S. Pat. No. 5,272,473, a beam movement frequency between approximately 5 Hz and 60 Hz, depending on light level, would be sufficiently undetectable by the human eye.

Figure 6:
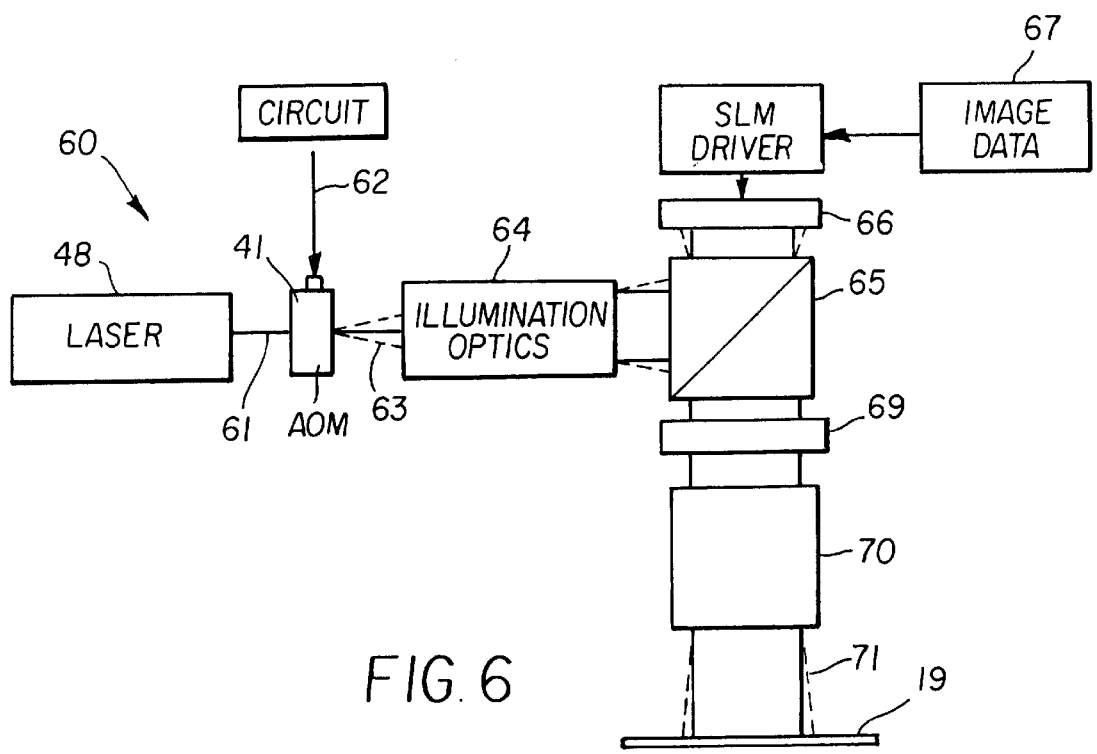
FIG. 6 is a schematic for an image projection system that uses an angularly varying beam to illuminate an area array device to project an image.

FIG. 6 shows a schematic for a laser system 60 capable of generating an angularly varying beam that illuminates an area array device to project an image. A laser beam 61 is directed towards an AOM 41. A variable frequency carrier signal 62 is injected into the AOM. The AOM outputs an angularly varying beam 63 towards expansion optics 64 that expand the beam. The expanded beam is directed towards a beamsplitter cube 65. On the adjacent side of the beamsplitter cube from the angularly varying beam entry, a spatial light modulator 66 projects an image from image data 67 provided to the spatial light modulator driver 68. The beamsplitter cube outputs an image through an optional polarizer 69, and then towards a projection lens 70. The output of the projection lens directs an angularly varying beam 71 towards a projection surface 19.

The image projected on the projection surface is speckle suppressed, since the angularly varying beam blends the speckle pattern of the beam with the image. As stated in the previous embodiment, the movement of the beam need only be approximately 1 pixel so as not to destroy the modulation transfer function (MTF) in the direction of the movement. Since the eye is very sensitive to horizontal and vertical edges, but less sensitive to angles in between, beam movement of approximately 45 degrees may minimize the loss of MTF in the horizontal and vertical directions. However, the beam movement frequency must be high enough to prevent any obvious flicker to the eye. For example, a beam movement frequency between approximately 5 Hz and 60 Hz would be sufficiently undetectable by the human eye. For the sake of simplicity, FIG. 6 shows only a single beam projection system. Multiple beams, e.g. red, green and blue, can be used from separate sources and spatial light modulators and then combined using an X-cube prism, or other suitable means, for a multicolor projection system. There are a number of examples of multibeam systems in the art of incoherent color projectors.

Figure 7:
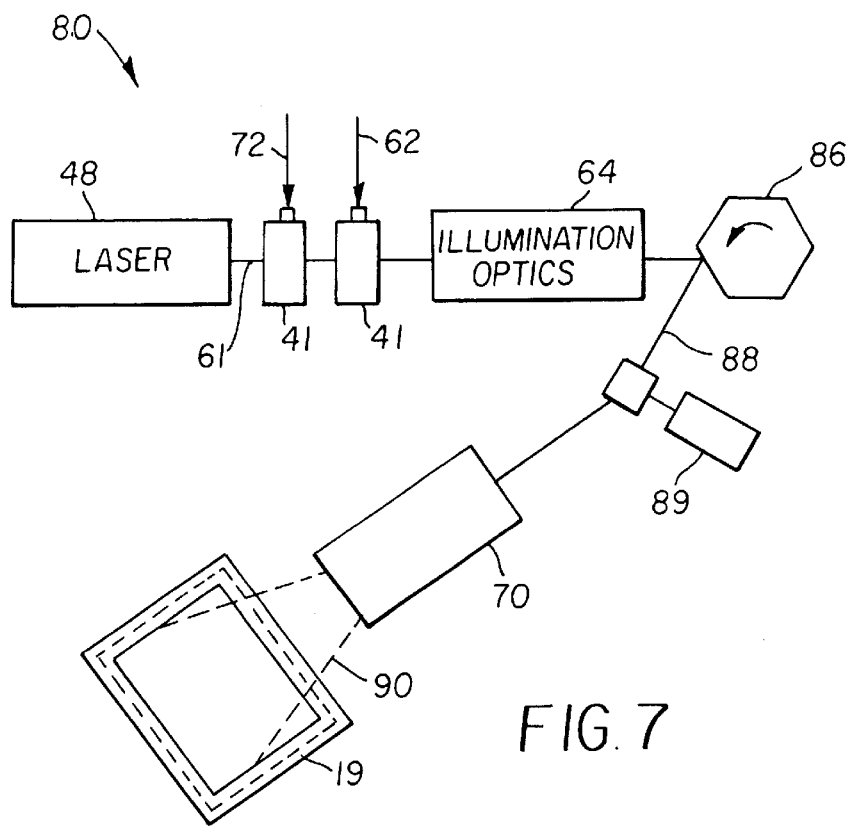
FIG. 7 is a schematic for an image projection system that uses an angularly varying beam in a raster scan laser imaging system.

FIG. 7 shows a schematic for a laser system 80 capable of generating an angularly varying beam in a raster scan laser system that projects an image pixel by pixel. The output beam 61 of a laser 48 is directed towards the input of an AOM 41. The AOM 41 is driven by a pixel modulation signal 72. The output beam of the AOM 42 is directed towards another AOM 63 directly in front of the output of the first AOM, which is driven by a variable frequency carrier signal 64. An angularly varying beam is outputted from the variable frequency driven AOM towards a set of optics 65. The output beam from the optics is directed towards a high speed horizontal deflector, such as a polygon 86. The reflected beam 88 from the polygon is directed towards a slow speed vertical deflector 89, such as a galvanometer or mirror. The reflected beam from the vertical deflector is directed towards a projection lens 70. An angularly varying output beam 90 is outputted from the projection lens towards a projection surface 19.

The image projected on the screen is speckle suppressed, since the angularly varying beam blends the speckle pattern of the beam with the image. As stated in the previous embodiment, the movement of the beam need only be approximately 1 pixel so as not to destroy the modulation transfer function (MTF) in the direction of the movement. Since the eye is very sensitive to horizontal and vertical edges, but less sensitive to angles in between, beam movement of approximately 45 degrees may minimize the loss of MTF in the horizontal and vertical directions. However, the beam movement frequency must be high enough to prevent any obvious flicker to the eye. For example, a beam movement frequency between approximately 5 Hz and 60 Hz would be sufficiently undetectable by the human eye.

Thus, it is seen that speckle may be suppressed by the use of RF injection, optical feedback, Doppler shifted wavelength, or a deflection means suppresses speckle in a laser projection system.

The invention has been described in detail with particular reference to certain preferred embodiments thereof, but it will be understood that variations and modifications can be effected within the scope of the invention.

PARTS LIST

- 10. Laser projection system
- 11. Radio frequency (RF) oscillator
- 12. Semiconductor laser
- 13. Optical projection system
- 14. RF oscillator signal
- 15. DC bias signal
- 16. Multi-wavelength laser beam
- 17. Internal photodiode
- 18. Control circuit
- 19. Screen
- 20. Laser projection system
- 21. Constant current supply
- 22. Optical fiber
- 23. Thermoelectric cooler
- 24. Temperature controller
- 25. Laser
- 30. Laser projection system
- 31. Power supply
- 32. Partially reflecting mirror
- 40. Image projection system
- 41. Acousto-optic modulator (AOM)
- 42. Oscillator
- 43. Radio frequency (RF) signal
- 44. Modulation oscillator
- 45. Modulation signal
- 46. Frequency modulator
- 47. RF modulated signal
- 48. Laser
- 50. Image projection system
- 60. Laser projection system
- 61. Laser beam
- 62. Carrier signal
- 63. Varying beam
- 64. Expansion optics
- 65. Beamsplitter cube
- 66. Spatial light modulator
- 67. Image data
- 68. Modulator driver
- 69. Polarizer 70. Projection lens
71. Angularly varying beam
72. Pixel modulation signal
80. Laser projection system
86. Polygon
88. Reflected beam
89. Vertical deflector
90. Output beam

What is claimed is:

1. A speckle suppressed laser projection system comprising:
   a constant current supply;
   a semiconductor laser;
   an optical fiber positioned in front of an output of said laser, wherein said fiber induces optical feedback in said laser which causes said laser to produce a multimode output beam; and
   an optical projection system, wherein said optical projection system projects said multimode beam on a screen.

2. A speckle suppressed laser projection system as in claim 1 wherein a thermoelectric cooler maintains the temperature of said laser and said fiber.

3. A speckle suppressed laser projection system as in claim 2 wherein a temperature controller controls said thermoelectric cooler.

4. A speckle suppressed laser projection system as in claim 1 wherein image data is supplied to said optical projection system.

5. A speckle suppressed laser projection system comprising:
   a laser which projects a beam;
   a partially reflecting mirror located in front of said laser and which partially reflects a portion of said beam back to said laser which cause said laser to generate a multimode beam;
   wherein a portion of said multimode beam is transmitted through said partially reflecting mirror; and
   an optical projection system which projects said multimode beam onto a screen.

6. A speckle suppressed laser projection system as in claim 5 wherein image data is supplied to said projection system.

7. A method of speckle reduction, the method comprising the steps of:
   placing an optical fiber in front of the output window of a semiconductor laser;
   inducing optical feedback in said laser, wherein the output of said laser is a multimode beam;
   directing said multimode beam into an optical projection system;
   projecting said multimode beam onto a projection surface, wherein the multimode beam has different speckle patterns that blend together.

8. A method of speckle reduction, the method comprising the steps of:
   placing a partially reflecting mirror in front of the output window of a laser;
   reflecting part of the output beam of said laser with said partially reflecting mirror back into said laser;
   inducing optical feedback in said laser, wherein the output of said laser is a multimode beam;
   directing said multimode beam towards an optical projection system; and
   projecting said multimode beam onto a projection surface, wherein the multimode beam has different speckle patterns that blend together.

* * * * *